United States Patent [19]

Chiba et al.

[11] Patent Number: 5,063,568
[45] Date of Patent: Nov. 5, 1991

[54] WAVELENGTH STABILIZED LIGHT SOURCE

[75] Inventors: Kazuharu Chiba, Yokohama; Yoshifumi Nakajima; Hideo Sumiyoshi, both of Kawasaki, all of Japan

[73] Assignee: Fujitsu Limited, Kawasaki, Japan

[21] Appl. No.: 474,098

[22] PCT Filed: Aug. 1, 1989

[86] PCT No.: PCT/JP89/00899
§ 371 Date: May 4, 1990
§ 102(e) Date: May 4, 1990

[87] PCT Pub. No.: WO90/03054
PCT Pub. Date: Mar. 22, 1990

[30] Foreign Application Priority Data

Sep. 5, 1988 [JP] Japan .................. 63-221816

[51] Int. Cl.$^5$ .............................................. H01S 3/10
[52] U.S. Cl. ........................................ 372/32; 372/26; 359/328
[58] Field of Search .................. 372/20, 29, 31, 32, 372/26, 22; 307/427

[56] References Cited

FOREIGN PATENT DOCUMENTS 213186 9/1987 Japan .
18820 1/1988 Japan .

OTHER PUBLICATIONS

English Abstract of 63-18820, Gas Cell Type Atomic Oscillator.
English Abstract of 62-213186, Semiconductor Laser Wavelength Stabilizer.

Primary Examiner—James W. Davie
Attorney, Agent, or Firm—Staas & Halsey

[57] ABSTRACT

A wavelength stabilized light source includes a laser diode which emits a laser beam of a wavelength of 1.56 μm. A second-harmonic generator generates a second-harmonic light of the laser beam. The second-harmonic light enters a resonator which includes a resonance cell in which $^{87}$Rb atoms are filled. A phase-modulated microwave is irradiated on said resonator. The reasonator outputs a double resonance signal when the wavelength of the second-harmonic light is equal to a resonance wavelength of $^{87}$Rb and the frequency of the microwave is equal to a transition frequency of $^{87}$Rb. A first control circuit controls the microwave so that the frequency of the microwave is equal to the transition frequency. A second control circuit controls the laser diode so that the wavelength of the second-harmonic light is equal to the resonance wavelength of $^{87}$Rb. Thereby, the wavelength of the emitted laser beam is stabilized at 1.56 μm.

20 Claims, 9 Drawing Sheets

WAVELENGTH STABILIZED LIGHT SOURCE

BACKGROUND OF THE INVENTION

1. Field of the Invention

The present invention generally relates to a wavelength stabilized light source, and more particularly to a wavelength stabilized light source which is suitable for a light source for use in coherent optical communications.

2. Background Art

Currently, optical communications are widely used. In optical communications, it is important to use a light source which emits a light having a stabilized wavelength. Presently, two different kinds of wavelength stabilized light sources have been put to practical use.

Figure 1A:
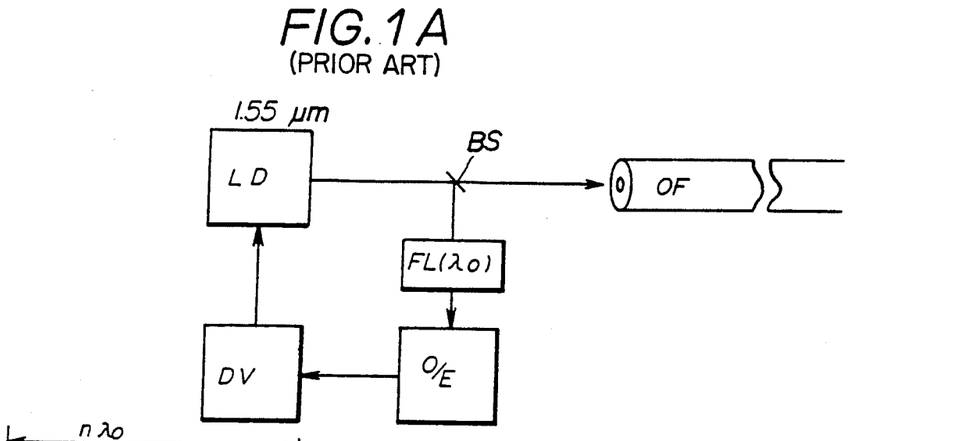
FIG. 1A is a block diagram of a first conventional light source.

FIG. 1A is a block diagram of a first kind of conventional wavelength stabilized light source. A laser diode (semiconductor laser) LD emits a light or laser beam having a wavelength of 1.55 μm. The laser beam emitted from the laser diode LD is split into two beams by a beam splitter BS. One of the split beams enters a transmission line formed by an optical fiber OF, and the other beam passes through a filter FL and is supplied to an opto-electric (photoelectric) converter O/E. The filter FL is designed to pass a light having a wavelength $\lambda_0$ equal to that of the laser beam to be penetrated in the optical filter OF. The opto-electric converter O/E converts the incident laser beam into a corresponding electric signal, which is supplied to a drive DV. The electric signal changes based on a deviation of the laser beam from the wavelength $\lambda_0$ of the filter FL. Thus, the driver DV changes a driving current based on the electric signal derived from the opto-electric converter O/E so that the laser diode LD emits the predetermined wavelength of light equal to 1.55 μm.

Figure 1B:
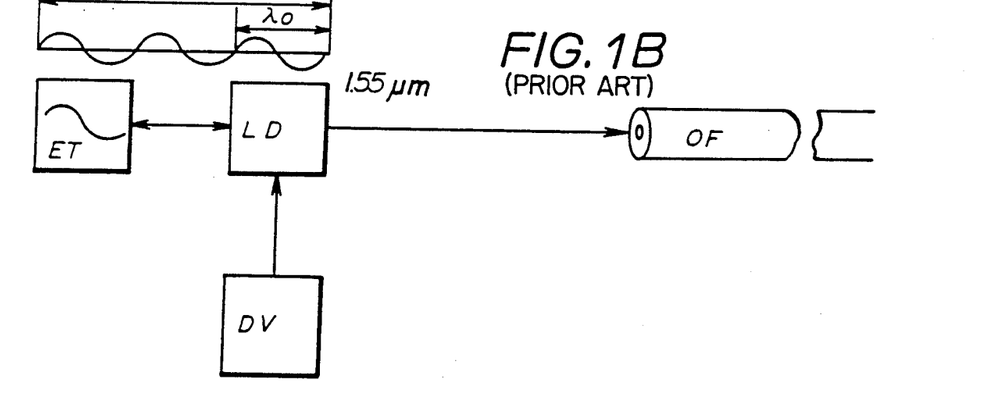
FIG. 1B is a block diagram of a second conventional light source.

FIG. 1B is a block diagram of a second conventional wavelength stabilized light source. The driver DV outputs a constant driving current to the laser diode LD, which emits not only light to be entered into the optical fiber OF but also light to be entered into an etalon ET. The etalon ET is disposed at a position where $n\lambda_0 = \lambda_0$ is satisfied (n is an integer). A light having the wavelength $\lambda_0$ resonates in the etalon ET and returns to the laser diode LD. Thus, only the laser beam having the wavelength $\lambda_0$ is increased and emitted toward the optical fiber OF.

However, the wavelength of light provided by the prior art shown in FIG. 1A is based on precision of the filter FL. Similarly, the wavelength of light provided by the prior art shown in FIG. 1B is based on precision of the etalon ET. For these reasons, neither the prior art shown in FIG. 1A nor the prior art shown in FIG. 1B cannot provide light of the wavelength which is absolutely equal to the desired wavelength $\lambda_0$. It is noted that recently there has been considerable activity in the development of phase modulation or frequency multiplexing in coherent optical communications. In such advanced optical communications, it is essential to use a light source which is capable of emitting light having an absolutely fixed (stabilized) wavelength.

Figure 2:
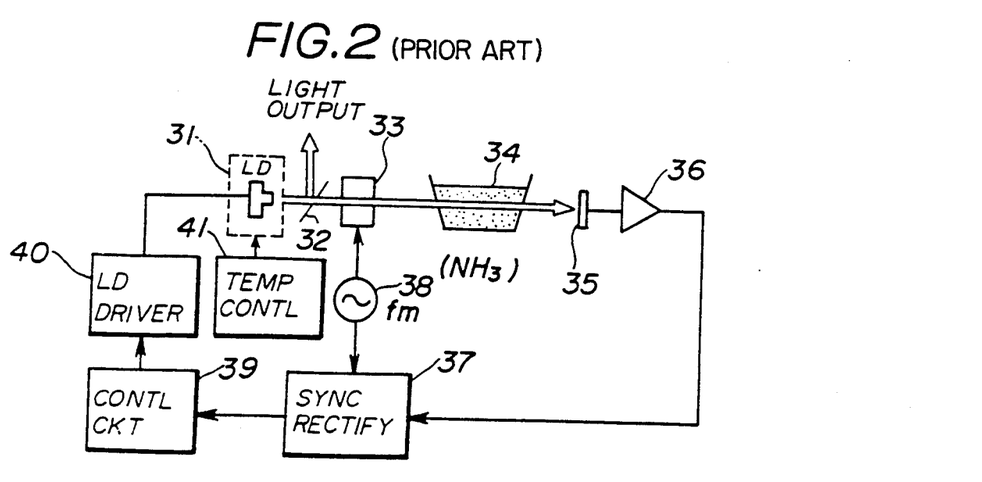
FIG. 2 is a block diagram of a third conventional light source.
Figure 3:
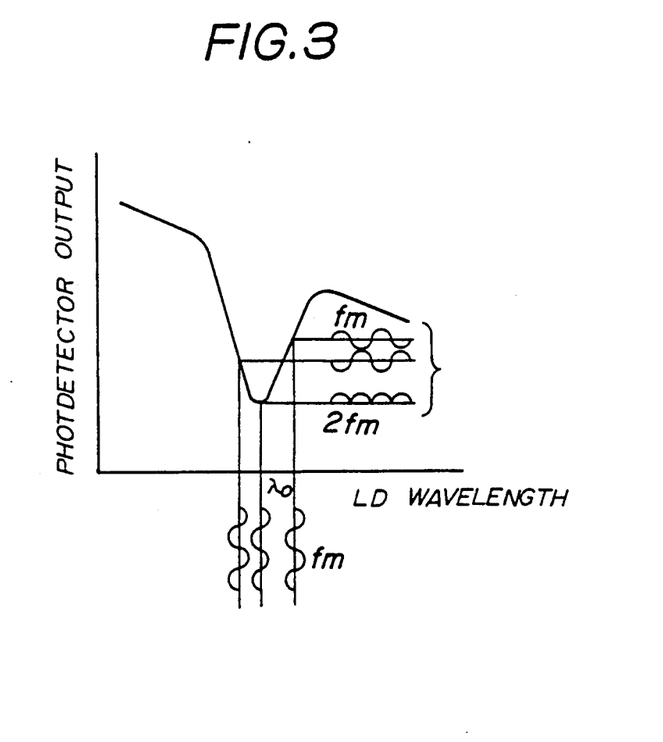
FIG. 3 is a graph of a photodetector output as a function of wavelength of light emitted from a laser diode used in the light source shown in FIG. 2.

FIG. 2 is a block diagram of a third conventional wavelength stabilized light source, which utilizes an absorption line of atoms (or molecules). The light source shown in FIG. 2 is superior to the prior art shown in FIG. 1A or 1B. Referring to FIG. 2, the illustrated light source is made up of a laser diode (semiconductor laser) 31, a beam splitter 32, a phase modulator 33, an absorption cell 34 in which an $NH_3$ gas is filled, a photodetector 35, an amplifier 36, a synchronous rectifying circuit 37, an oscillator 38 outputting a frequency fm, a control circuit 39, a laser diode driver 40 and a temperature controller 41. A laser beam emitted from the laser diode 31 is split into two beams by the beam splitter 32. One of the split beams is drawn as a light output of the light source, and the other beam is phase-modulated by the frequency fm through the phase modulator 33. The phase-modulated beam enters the absorption cell 34 which has an $NH_3$ gas having a resonance wavelength $\lambda_0$ within a band in the order of 1.5 μm. When the wavelength of the incident beam becomes equal to the wavelength of atoms (molecules) filled in the absorption cell 34, the incident light is absorbed the most greatly in the absorption cell 34. Thus, the photodetector 35 on which light from the absorption cell 34 is irradiated, generates a photodetector output as shown in a graph of FIG. 3 where the horizontal axis represents wavelength of the laser beam emitted from the laser diode 31 and the vertical axis thereof represents D.C. voltage value of the photodetector output. When the light from the absorption cell 34 is attenuated most greatly, the wavelength of the laser beam emitted from the laser diode 31 is equal to the resonance wavelength $\lambda_0$.

Since the incident light to the absorption cell 34 has been phase-modulated by the frequency fm, the photodetector output includes a signal component (an alternating component), the phase of which is different by 180 degrees on both sides of the resonance wavelength $\lambda_0$ the absorption cell 34. Particularly, when the wavelength of the incident light is equal to the resonance wavelength $\lambda_0$, the photodetector output includes a signal component of a frequency twice the modulation frequency fm (that is, a second-harmonic frequency signal of frequency 2fm).

Figure 4:
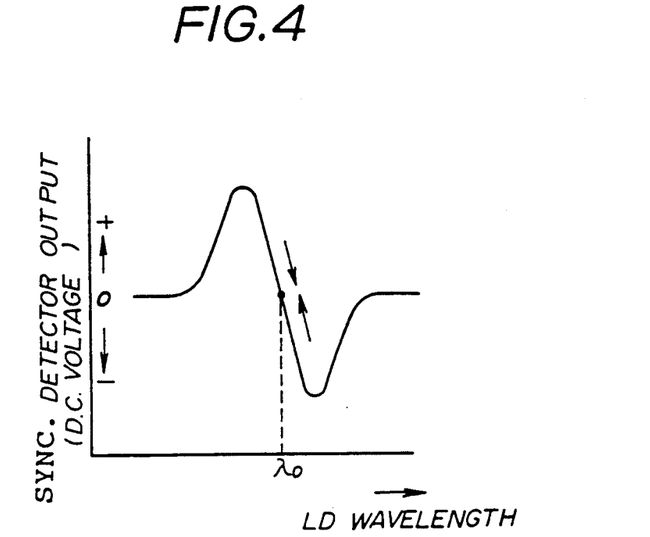
FIG. 4 is a graph of a synchronous detection output as a function of wavelength of light emitted from the laser diode used in the light source shown in FIG. 2.

The photodetector output is amplified through the amplifier 36 and supplied to the synchronous rectifying circuit 37, which subjects the amplified photodetector output to a synchronous detection process by the frequency fm generated by the oscillator 38. FIG. 4 is a graph of a synchronous detection output characteristic where the horizontal axis thereof represents wavelength of the laser diode 31 and the vertical axis represents the level of the synchronous detection output (D.C. voltage) derived from the synchronous rectifying circuit 37. When the laser diode 31 emits a light having a wavelength shorter than the resonance wavelength $\lambda_0$, the polarity of the synchronous detection output is negative. Adversely, when the laser diode 31 emits a light having a wavelength longer than the resonance wavelength $\lambda_0$, the polarity of the synchronous detection output is positive.

The control circuit 39 drives the laser diode driver 40 so that the synchronous detection output supplied from the synchronous rectifying circuit 37 becomes zero at the resonance wavelength $\lambda_0$. The laser diode driver 40 controls the driving current to be supplied to the laser diode 31 so that the wavelength of the beam emitted from the laser diode 31 is always equal to the wavelength $\lambda_0$. It has been confirmed that the Q of the conventional resonance characteristic is approximately $1 \times 10^{-5}$ and the fluctuation (stability over a short period) of wavelength $\sigma y(\tau)$ is approximately $1 \times 10^{-11}$.

It is noted that at present the optimum wavelength of light suitable for coherent optical communications is 1.56 μm in view of efficiency in transmission loss caused in optical fiber. The light output supplied from the beam splitter 32 shown in FIG. 2 is of the wavelength equal to 1.56 μm. Since the wavelength of light is highly stabilized, the conventional light source shown in FIG. 2 can conceivable to be used as a light source in coherent optical communications.

However, the light source shown in FIG. 2 presents the following disadvantage. That is, the degree of light absorption caused in the absorption cell 34 shown in FIG. 2 is very weak (in other words, the concave peak of the resonance pattern is shallow). For this reason, the stability of the light source is not good.

SUMMARY OF THE INVENTION

Accordingly, a general object of the present invention is to provide a novel and useful wavelength stabilized light source in which the disadvantages of the aforementioned prior art are eliminated.

A more specific object of the present invention is to provide a wavelength stabilized light source capable of emitting a light having an extremely stabilized wavelength.

Another object of the present invention is to provide a wavelength stabilized light source which is suitable for advance optical communications which employ an advanced technique such as phase modulation or frequency multiplexing.

The above objects of the present invention can be achieved by a wavelength stabilized light source which has the following Laser beam emitting means are provided for emitting a laser beam provided as an output light of the light source. Harmonic generating means are provided for generating a harmonic light of a frequency which is n times (n is an integer equal to or larger than 2) the frequency of the laser beam. Resonator means are provided, having a resonance cell including a resonance substance, for generating a double resonance in the resonance cell by irradiating the harmonic light supplied from the harmonic generating means onto the resonance substance and by irradiating a microwave onto the resonance cell and for generating a double resonance signal based on the generated double resonance. The the microwave has an alternating component. The light source further has microwave controlling means, coupled to the resonator means, for controlling the microwave to be irradiated onto the resonance cell so that the frequency of the microwave is equal to a predetermined microwave resonance frequency on the basis of the double resonance signal supplied from the resonator means. The light source also has laser beam wavelength controlling means, coupled to the resonator means and the laser beam emitting means, for controlling the laser beam emitting means so that the wavelength of the harmonic light generated by the harmonic generating means is equal to a resonance wavelength of the resonance substance provided in the resonance cell on the basis of the double resonance signal.

The above-mentioned objects of the present invention can also be achieved by a wavelength stabilized light source with the following. Laser beam emitting means are provided for emitting a laser beam provided as an output light of the light source, light modulating means are provided for phase-modulating the laser beam by a modulation frequency. Harmonic generating means for generating a harmonic light of a frequency which is n times (n is an integer equal to or larger than 2) the frequency of the laser beam. Resonator means are provided, having a resonance cell including a resonance substance, for generating a double resonance in the resonance cell by irradiating the harmonic light supplied from the harmonic generating means onto the resonance substance and by irradiating a microwave onto the resonance cell and for generating a double resonance signal based on the generated double resonance. The double resonance signal includes a component of the modulation frequency. The light source further has microwave controlling means, coupled to the resonator means, for controlling the microwave to be irradiated onto the resonance cell so as to be equal to a predetermined microwave resonance frequency on the basis of the double resonance signal supplied from the resonator means. The light source also has laser beam wavelength controlling means, coupled to the resonator means and the laser beam emitting means, for controlling the laser beam emitting means so that the wavelength of the harmonic light generated by the harmonic generating means is equal to a resonance wavelength of the resonance substance provided in the resonance cell on the basis of the modulation frequency component included in the double resonance signal.

The aforementioned objects of the present invention can also be achieved from a wavelength stabilized light source with the following. Laser beam emitting means are provided for emitting a laser beam provided as an output light of the light source harmonic generating means are provided for generating a harmonic light of a frequency which is n times (n is an integer equal to or larger than 2) the frequency of the laser beam. Resonator means are provided, having a resonance cell including a resonance substance, for generating a double resonance in the resonance cell by irradiating the harmonic light supplied from the harmonic generating means onto the resonance substance and by irradiating a microwave onto the resonance cell and for generating a double resonance signal based on the generated double resonance. Magnetic field providing means are provided for providing the resonator means with a magnetic field having an alternating change, the double resonance signal including a signal component corresponding to the alternating change of the magnetic field. The light source further has microwave controlling means, coupled to the resonator means, for controlling the microwave to be irradiated onto the resonance cell so that the frequency of the microwave is equal to a predetermined microwave resonance frequency on the basis of the double resonance signal supplied from the resonator means. The light source also has laser beam wavelength controlling means, coupled to the resonator means and the laser beam emitting means, for controlling the laser beam emitting means so that the wavelength of the harmonic light generated by the harmonic generating means is equal to a resonance wavelength of the resonance substance included in the resonance cell on the basis of the signal component included in the double resonance signal.

Additional objects, features and advantages of the present invention will become apparent from the following detailed description when read in conjunction with the accompanying drawings.

DESCRIPTION OF THE PREFERRED EMBODIMENTS

Figure 5:
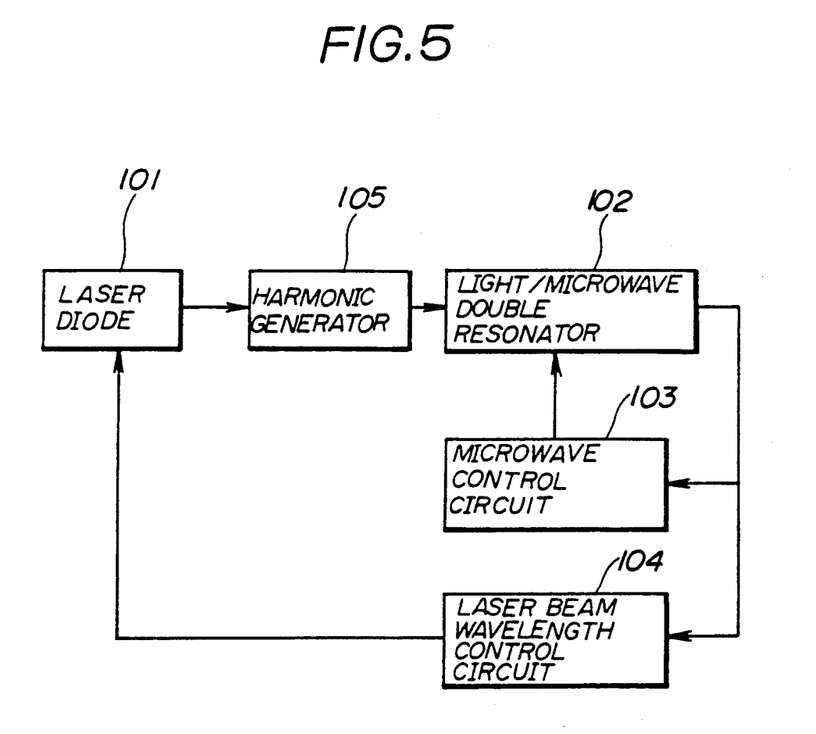
FIG. 5 is a block diagram illustrating the principle of the present invention.

A description is given of the principle of the present invention with reference to FIG. 5, which is a block diagram illustrating the principle of the present invention.

Referring to FIG. 5, a laser diode (semiconductor laser) 101 emits a laser beam. A harmonic generator 105 generates a light having a wavelength which is 1/n (n is an integer equal to or larger than 2) times the wavelength of the beam emitted from the laser diode 101. In other words, the harmonic generator 105 generates a light having a frequency which is n times the the frequency of the beam emitted from the laser diode 101. A light/microwave double resonator 102 (hereinafter simply referred to as a resonator) generates a double resonance caused due to the harmonic light supplied from the harmonic generator 105 and a microwave applied thereto. The resonator 102 includes a cavity which accommodates a resonance cell in which atoms (or molecules) are filled. The atoms in the resonance cell have an inherent microwave resonance frequency and an inherent light absorption line (resonance wavelength). The microwave to be applied to the resonator 102 has been phase-modulated. Then, the phase-modulated microwave is irradiated onto the resonance cell in the cavity. When the wavelength of the harmonic light derived from the generator 105 is equal to the resonance wavelength of atoms provided in the resonance cell and simultaneously the frequency of the microwave is equal to the microwave resonance frequency, the double resonance occurs. Then the resonator 102 outputs a double resonance signal based on the generated double resonance, which is supplied to a microwave controller 103 and a wavelength controller 104. The microwave controller 103 operates on the basis of the signal supplied from the resonator 102 and controls the frequency of the microwave so as to be always equal to the microwave resonance frequency of the atoms in the resonance cell. The wavelength controller 104 operates on the basis of the signal supplied from the resonator 102 and controls the laser diode 101 so that the wavelength of the harmonic light derived from the harmonic generator 105 is always equal to the resonance wavelength of the atoms filled in the resonance cell. Thus, the wavelength of the light emitted from the laser diode 101 is based on the degree of stability of the atomic resonance frequency of atoms provided in the resonance cell. As a result, the wavelength of light emitted from the laser diode 101 can be stabilized with extremely high precision.

For example, the semiconductor laser 101 emits light having a wavelength of 1.56 $\mu$m. The resonator 102 has rubidium (Rb) atoms, the resonance wavelength of which is equal to 0.78 $\mu$m. The harmonic generator 105 generates a second-harmonic light (laser beam) of a frequency twice the frequency of the light emitted from the laser diode 101. Thus, the wavelength of the light to be applied to the resonator 102 is equal to half of the wavelength (1.56 $\mu$m) of the laser diode 101, which is identical to the resonance wavelength of rubidium atoms.

Figure 6:
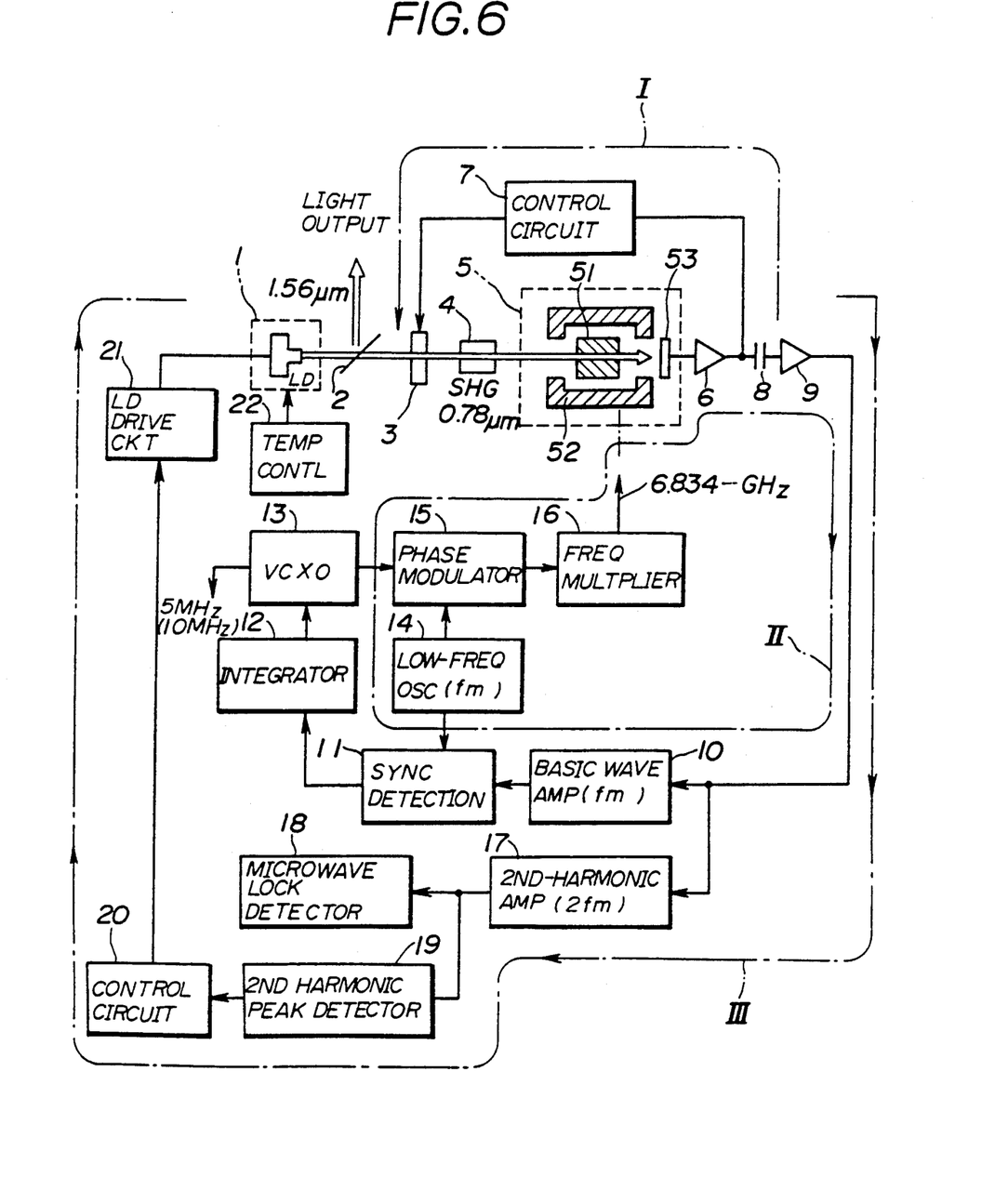
FIG. 6 is a block diagram of a first preferred embodiment of the present invention.

A description is given of a first preferred embodiment of the present invention with reference to FIG. 6. Referring to FIG. 6, a laser diode (semiconductor laser) 1 emits a laser beam having a wavelength of 1.56 $\mu$m. The laser beam emitted from the laser diode 1 is split into two beams by a beam splitter 2. One of the split beams is drawn as a light output of the light source. The other beam passing through the beam splitter 2 is irradiated onto a second-harmonic generator (SHG) 4 through a voltage-controlled polarizing filter 3.

The second-harmonic generator 4 generates a second-harmonic light of a frequency twice the frequency of the laser beam emitted from the laser diode 1. That is, the wavelength of the second-harmonic light is equal to 0.78 $\mu$m. The second-harmonic generator 4 is formed of KTP or $KNbO_3$, for example. The light passing through the second-harmonic generator 4 enters a light-/microwave double resonator (hereinafter simply referred to as a resonator) 5. The resonator 5 includes a resonance cell 51, a cavity 52, and a photodetector 53. As will be described later, a coil is wound around the cavity 52. The cavity 52 has a microwave resonance frequency of 6.834 GHz. The resonance cell 51 is accommodated in the cavity 52, and filled with $^{87}Rb$ atoms. The resonator 5 forms a light pumping type rubidium atomic oscillator together with a microwave control loop II, which will be described in detail later. The combination of the resonator 5 and the microwave control loop II is disclosed in Japanese Laid-Open Patent Application No. 63-18820, for example.

Light passing through the resonance cell 51 is irradiated onto the photodetector 53, which outputs a photodetector signal. The photodetector signal is amplified through an amplifier 6, and supplied to a control circuit 7. The control circuit 7 forms a light intensity stabilizing control loop I and controls the degree of polarization presented by the voltage-controlled polarizing filter 3 on the basis of the amplified signal derived from the amplifier 6. It is preferable to use the light intensity stabilizing loop I. However, the light intensity stabilizing control loop I may be omitted. On the other hand, the amplified signal from the amplifier 6 passes through a capacitor 8 and an amplifier 9, and is then supplied to the microwave control loop II as well as a laser beam wavelength control loop III.

The microwave control loop II is made up of a basic wave amplifier 10, a synchronous detection circuit 11, an integrator 12, a voltage-controlled crystal oscillator (VCXO) 13, a low-frequency oscillator 14, a multiplier/synthesizer phase modulator (hereinafter simply referred to as a phase modulator) 15, and a frequency multiplier 16. The voltage-controlled crystal oscillator 13 outputs a signal of a frequency of 5 MHz or 10 9MHz, for example. The output signal is frequency-multiplied and then phase-modulated by a low-frequency signal through the phase modulator 15. The phase-modulated signal is frequency-multiplied through the frequency multiplier 16 so that a microwave having a frequency equal to 6.834 GHz is generated. The generated phase-modulated microwave is supplied to the cavity 52. A basic wave component (microwave resonance signal) included in the photodetector signal derived from the photodetector 53 is amplified through the basic wave amplifier 10 and is then subjected to a synchronous detection process by the synchronous detection circuit 11. The output signal of the synchronous detection circuit 11 is integrated by the integrator 12, which controls the voltage-controlled crystal oscillator 13 so that the frequency of the microwave signal supplied to the cavity 52 is always equal to the microwave resonance frequency (equal to 6.834 GHz) of $^{87}$Rb atoms provided in the resonance cell 51.

On the other hand, the laser beam wavelength control loop III is made up of a second-harmonic component amplifier 17, a second-harmonic component peak detector 19, a control circuit 20, a laser diode driving circuit 21, the laser diode 1, the second-harmonic generator 4 and the resonance cell 51. As will be described in detail later, the laser beam wavelength control loop III detects a second-harmonic component of the microwave resonance signal and controls the laser diode driving circuit 21 so as to maximize the detected second-harmonic component. The second-harmonic component is of a frequency (2fm) twice the frequency (fm) of the microwave generated by the low-frequency generator 14. Thereby, a half of the wavelength of the laser beam emitted from the laser diode 1 is stabilized so that it corresponds to the light absorption line (resonance wavelength $\lambda_0$) for $^{87}$Rb atoms.

A microwave lock detector 18 indicates the amplitude of the amplified second-harmonic component supplied from the second-harmonic component amplifier 17. A temperature control circuit 22 controls temperature around the laser diode 1.

A description is given of an operation of the first embodiment. The laser beam emitted from the laser diode 1 is split into two beams, one of which is drawn as an output light of the light source, and the other beam is supplied to the second-harmonic generator 4 through the voltage-controlled polarizing filter 3. The second-harmonic generator 4 converts the laser beam of a wavelength of 1.56 μm emitted from the laser diode 1 into a laser beam of a wavelength of 0.78 μm. The converted laser beam enters, as an incident laser beam, the resonance cell 51 in which $^{87}$Rb atoms are filled.

The cavity 52 of the resonator 5 is supplied with the phase-modulated microwave of 6.834 GHz. The phase-modulated microwave and the incident laser beam cause the double resonance in the resonator 5. That is, light passing through the resonance cell 51 is absorbed most greatly when the wavelength of the incident laser beam is equal to the resonance wavelength $\lambda_0$ of $^{87}$Rb (D$_2$ line of $^{87}$Rb) and when the frequency of the phase-modulated microwave is the microwave resonance frequency $f_0$ ($f_0$=6.834 GHz) of $^{87}$Rb. The microwave resonance frequency $f_0$ of $^{87}$Rb corresponds to a transition frequency between a line (energy level) of 5S1/2, F=2 and m$_F$=0 and a line (energy 5S1/2, F=1 m$_F$=0 of $^{87}$Rb. When the double resonance occurs in the resonance cell 51, a light/microwave double resonance signal is derived from the photodetector 53.

Figure 7:
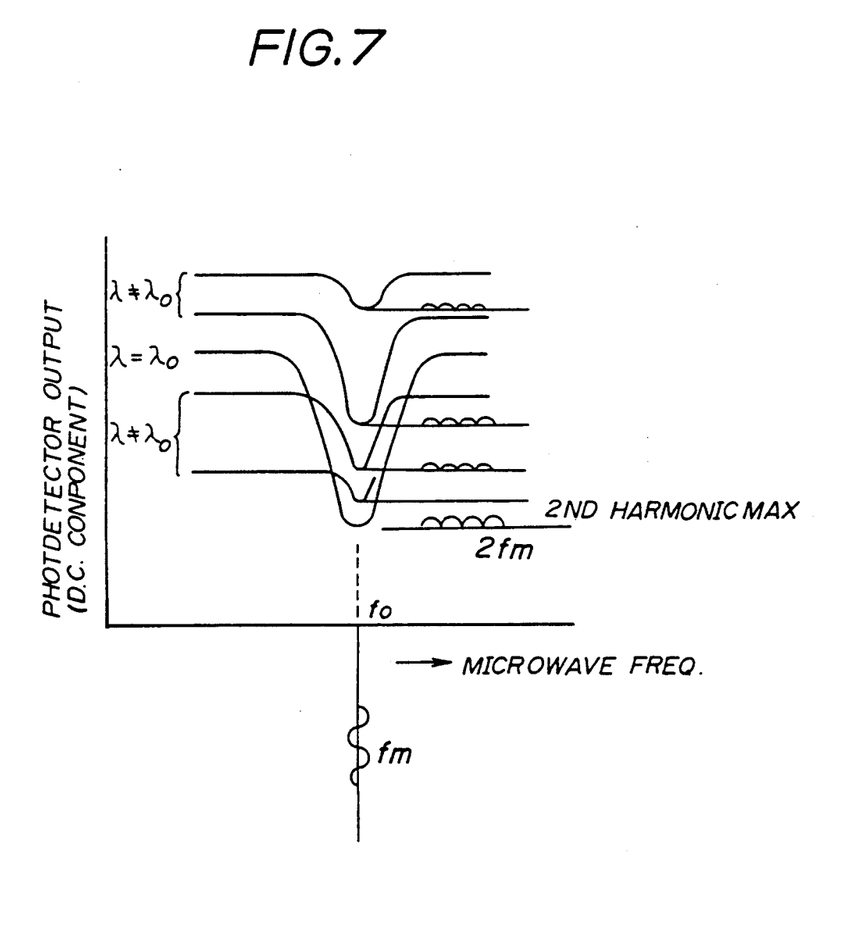
FIG. 7 is a graph of photodetector output characteristics.

FIG. 7 is a graph of double resonance characteristics in which the horizontal axis thereof represents microwave frequencies and the vertical axis represents the amplitude of photodetector outputs (D.C. component). FIG. 7 illustrates double resonance characteristics for different wavelengths $\lambda$ of the incident laser beams. It can be seen from FIG. 7 that the degree of light absorption is based on the degree of coincidence of wavelength $\lambda$ of the incident laser beam and resonance wavelength $\lambda_0$. Thus, not only the D.C. component derived from the photodetector 53 but also the depth of light absorption change on the basis of values of wavelength $\lambda$. Particularly, when $\lambda=\lambda_0$, the greatest depth of light absorption is obtained.

Since the microwave applied to the cavity 52 has been phase-modulated by the low-frequency fm. Thus when the microwave deviates from the microwave resonance wavelength $\lambda_0$, the photodetector output includes a component of the frequency fm, the phase of which is different by 180 degrees on both sides of the microwave resonance frequency $f_0$. On the other hand, when the phase-modulated microwave applied to the cavity 42 is equal to the microwave resonance frequency $f_0$, the second-harmonic component (alternating component) of 2fm is included in the photodetector output. It can be seen from FIG. 7 that when $\lambda=\lambda_0$, the maximum amplitude of the second-harmonic component is obtained.

The microwave control loop II operates in the same manner as the conventional microwave control loop disclosed in Japanese Laid-Open Patent Application No. 63-18820. The photodetector output is subjected to the synchronous detection process in the the synchronous detection circuit 11. The oscillation frequency of the voltage-controlled crystal oscillator 13 is controlled so that the synchronous detection signal derived from the synchronous detection circuit 11 always becomes zero. Thereby, the microwave supplied from the frequency multiplier 16 is automatically controlled so as to be always equal to the microwave resonance frequency $f_0$.

On the other hand, the second-harmonic component amplifier 17 of the laser beam wavelength control loop III amplifies the 2fm frequency signal (second-harmonic component) included in the photodetector output derived from the photodetector 53. The second-harmonic component peak detection circuit 19 detects the largest peak (amplitude) of the amplitude second-harmonic component. The control circuit 20 controls the laser diode driving circuit 21 so as to change the wavelength of the light emitted from the laser diode 1 so that the amplitude of the second-harmonic component becomes the maximum value. Thereby, the wavelength of the laser beam emitted from the laser diode 1 is automatically controlled so that the wavelength of the second-harmonic light from the second-harmonic generator 4 is always equal to the light absorption line of $^{87}$Rb atoms. In other words, the wavelength of the laser beam emitted from the laser diode 1 can be stabilized at 1.56 μm with a stability of extremely stable atomic resonance frequency of $^{87}$Rb atoms. The output frequency of the voltage-controlled crystal oscillator 13 is also stabilized with the same stability.

As described previously, the light intensity stabilizing control loop I compensates a slight change of the microwave resonance frequency $f_0$ due to a change in light intensity of the laser beam emitted from the laser diode 1, which is caused by changing the driving current to control the wavelength of the emitted laser beam. The control circuit 7 controls the voltage-controlled polarizing filter 3 on the basis of the D.C. component included in the photodetector output so that an amount of the light passing through the filter 3 is adjusted. Thereby, the intensity of the light or laser beam supplied to the resonance cell 51 is stabilized. The light intensity stabilizing control loop I contributes to further stabilizing the wavelength of the laser beam emitted from the laser diode 1. However, as indicated before, the loop I may be omitted.

The position where the voltage-controlled polarizing filter 3 is provided, is not limited to the position shown in FIG. 6. Alternatively, the voltage-controlled polarizing filter 3 may be interposed between the laser diode 1 and the beam splitter 2. The resonance cell 51 of the first embodiment contains only $^{87}$Rb atoms. Alternatively, natural Rb atoms which contains $^{87}$Rb atoms may be provided in the resonance cell 51.

Figure 8:
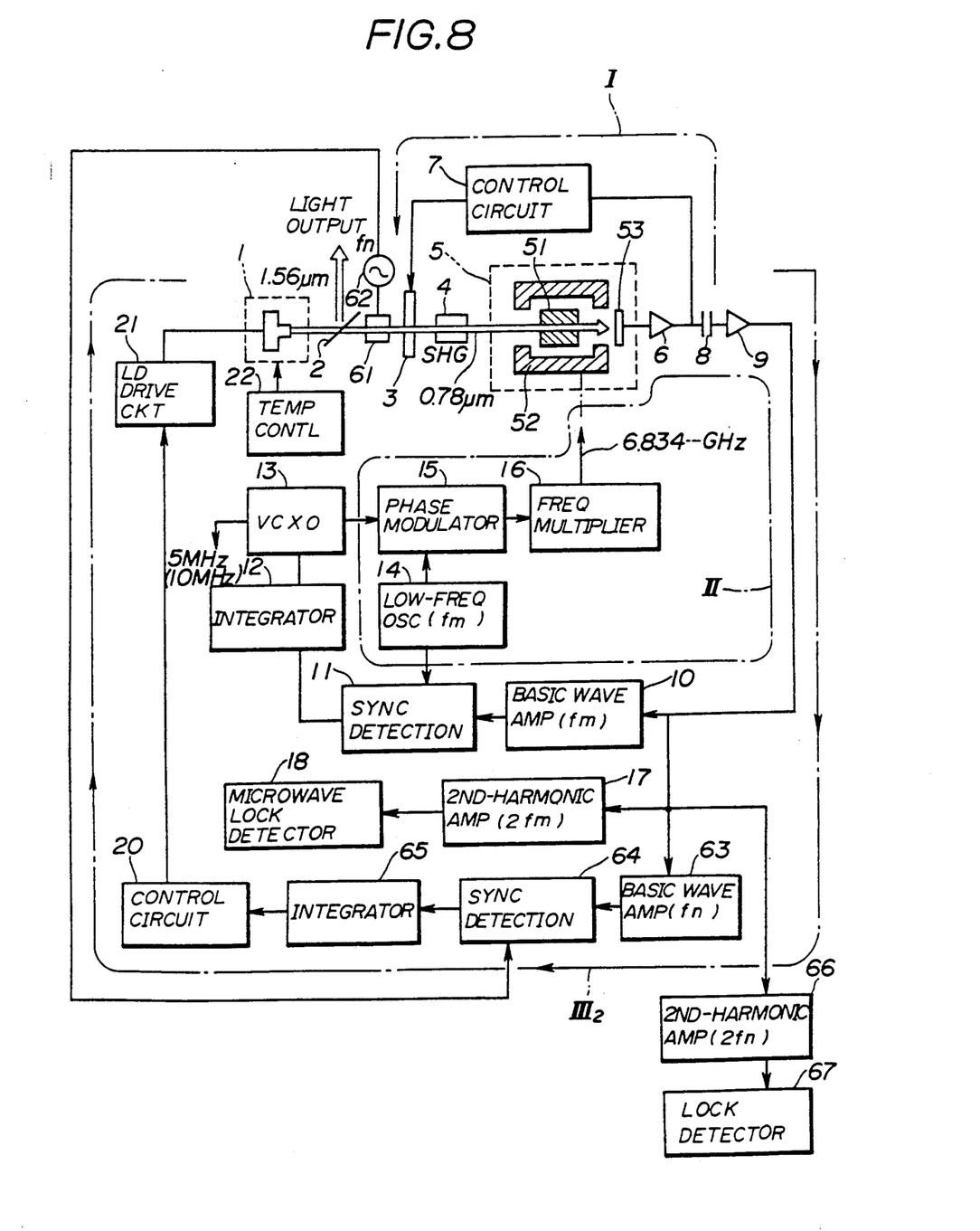
FIG. 8 is a block diagram of a second preferred embodiment of the present invention.

A description is given of a second preferred embodiment of the present invention with reference to FIG. 8, in which those parts which are the same as those in FIG. 6 are given the same reference numerals. The second embodiment has a laser beam wavelength control loop III$_2$ which is different from the laser beam wavelength control loop III of the first embodiment. The laser beam wavelength control loop III$_2$ includes a basic wave amplifier 63, a synchronous detection circuit 64 and an integrator 65 in addition to the control circuit 20, the laser diode driving circuit 21 and so on. Further, the second embodiment includes a phase modulator 61 and an oscillator 62. A second-harmonic amplifier 66 and a lock circuit 67, which are not essential to provide the feature of the second embodiment, may be provided as shown in FIG. 8. The second-harmonic amplifier 66 amplifies the second-harmonic signal of a frequency 2fn.

The phase modulator 61 is arranged between the beam splitter 2 and the voltage-controlled polarizing filter 3. The oscillator 62 generates an output signal having a modulation frequency fn, which is supplied to the phase modulator 61. The value of the modulation frequency fn may be set arbitrarily. For example, the modulator frequency fn is selected between a few kirohertz and a few megahertz. The phase modulator 61 phase-modulates the laser beam from the beam splitter 2 by the modulation frequency fn. The phase modulator 61 may be formed by a conventional phase modulator available in the market. The output signal derived from the oscillator 62 is supplied to the synchronous detection circuit 64. The basic wave amplifier 63 amplifies a signal component of the frequency fn included in the photodetector output. The amplified fn signal component is subjected to the synchronous detection process by the frequency fn through the synchronous detection circuit 64. The output signal supplied from the synchronous detection circuit 64 is integrated through the integrator 65, and is then supplied to the control circuit 20.

Figure 9A:
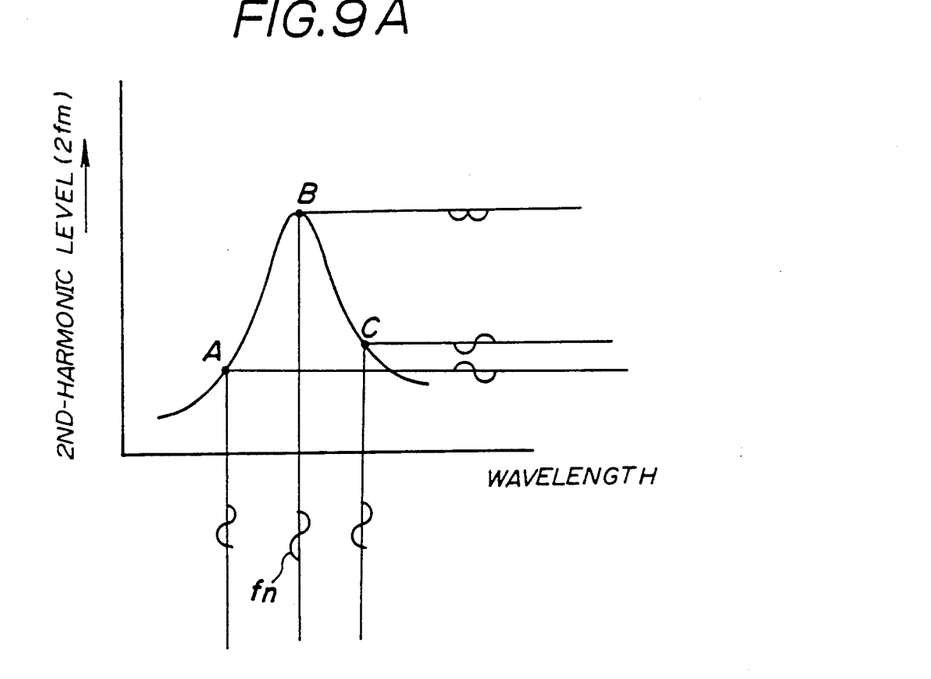
FIG. 9A is a graph of a second-harmonic component v. wavelength characteristic for the second embodiment.

FIG. 9A is a graph of the second-harmonic component of the frequency 2fm included in the photodetector output. In FIG. 9A, the horizontal axis represents wavelength of the second harmonic light derived from the second-harmonic generator 4, and the vertical axis represents amplitude of the second-harmonic component. When the wavelength of the second-harmonic light is equal to the resonance wavelength $\lambda_0$ of $^{87}$Rb (a wavelength B), the amplitude of the second-harmonic component is the largest. At this time, the second-harmonic signal of the frequency 2fn is obtained. When the wavelength of the second-harmonic light is not equal to the wavelength B, the basic wave component of the frequency fn is obtained. The basic wave component obtained when the second-harmonic light has a wavelength A is 180 degrees out of phase with the basic wave component obtained when the second-harmonic light laser beam has a wavelength C.

Figure 9B:
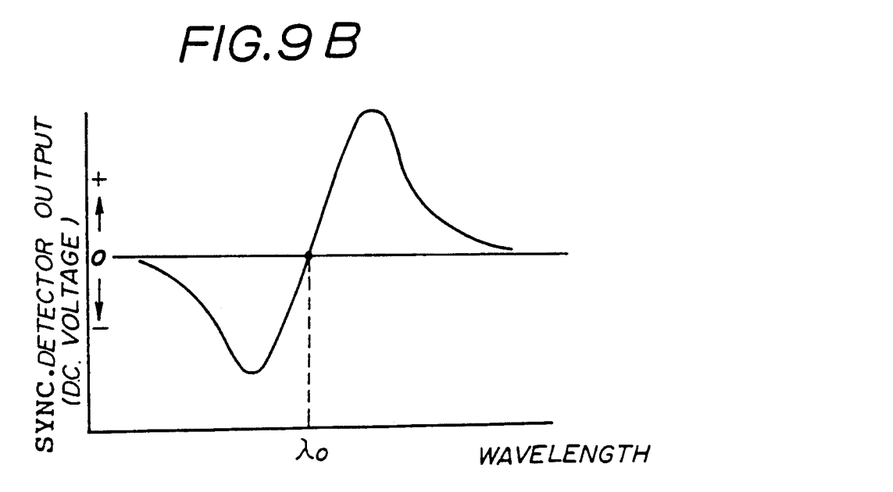
FIG. 9B is a graph of a synchronous detection output as a function of wavelength of a second-harmonic light for the second embodiment.

FIG. 9B is a graph of a synchronous detection output characteristic. In FIG. 9B, the horizontal axis represents wavelength of the second-harmonic light, and the vertical axis represents amplitude of the synchronous detection output derived from the synchronous detection circuit 64. The polarity of the synchronous detection signal is opposite on both sides of the resonance wavelength $\lambda_0$.

The first embodiment controls the wavelength of the emitted laser beam so as to obtain the largest amplitude (peak) of the second-harmonic component of frequency 2fm. It is noted that a change of the amplitude of the second-harmonic component is not large around its peak. On the other hand, the second embodiment controls the wavelength of the emitted laser beam so as to set the synchronous detection signal equal to zero. Thus, the second embodiment can control the wavelength of the emitted laser beam more precisely than the first embodiment.

Figure 10:
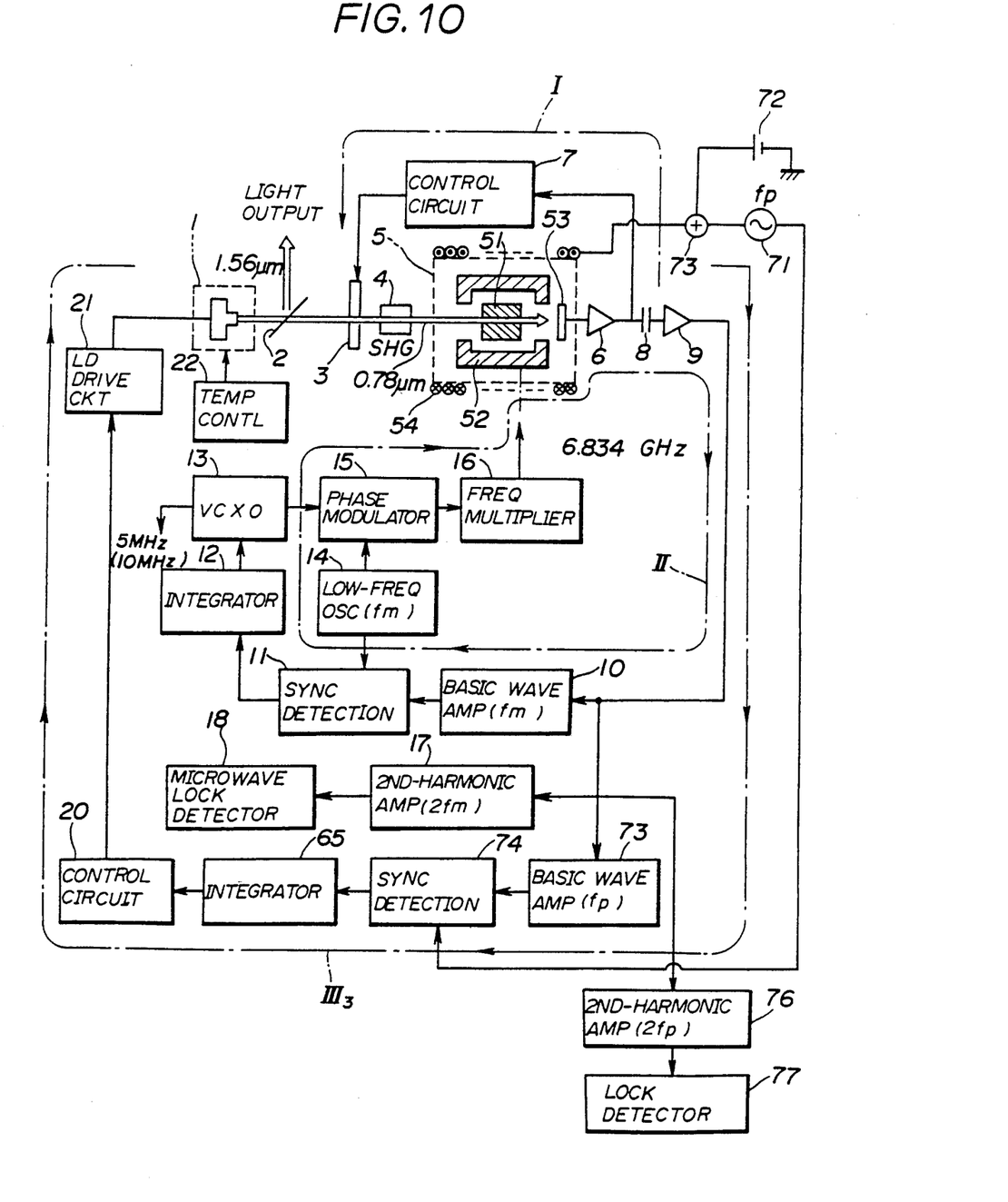
FIG. 10 is a block diagram of a third embodiment of the present invention.

A description is given of a third preferred embodiment of the present invention with reference to FIG. 10, in which those parts which are the same as those shown in FIGS. 6 and 8 are given the same reference numerals. The third embodiment has a laser beam wavelength control loop III$_3$, which is different from the aforementioned laser beam wavelength control loop III or III$_2$. The laser beam wavelength control loop III$_3$ includes a basic wave amplifier 73, and a synchronous detection circuit 74 in addition to the integrator 65, the control circuit 20, the laser diode driving circuit 21 and so on. Further, the third embodiment includes an oscillator 71 generating an alternating component of a frequency fp, a D.C. power source 72, and an adder 73. A second-harmonic component amplifier 76 and a lock circuit 77 may be provided as shown in FIG. 10. The second-harmonic component amplifier 76 amplifies the second-harmonic signal of a frequency twice the frequency fp. The value of the frequency fp is arbitrarily selected. For example, the frequency fp is set equal to between hundreds of hertz and a few kirohertz.

A coil 54 is wound around the cavity 52. In FIGS. 6 and 8, the coil 54 is omitted for the sake of simplicity. In each of the first and second embodiments, a direct current passes through the coil 54 from the D.C. power source 72 to ground. Thereby, so-called a C-field (magnetic field) is generated in the cavity 52. According to the third embodiment, the alternating component of the frequency fp derived from the oscillator 71 is added to the direct current by the adder 73. The alternating component passes through the coil 54 and causes a slight change of the transition frequency (microwave resonance frequency).

Figure 11A:
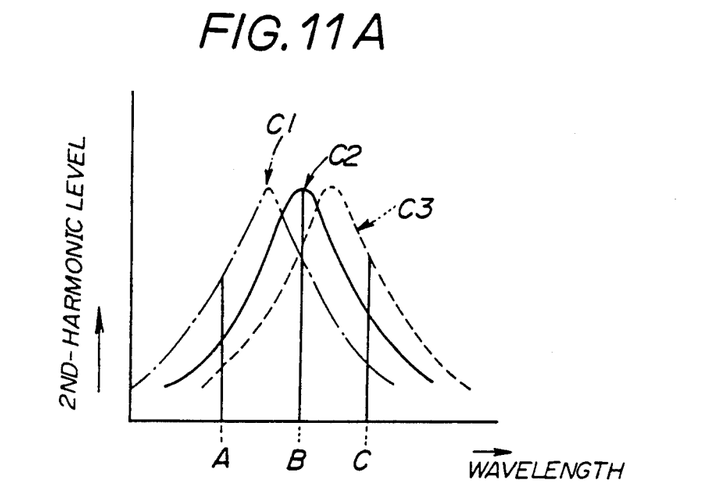
FIG. 11A is a graph of a second-harmonic component v. wavelength characteristic for the third embodiment.

FIG. 11A is a graph illustrating three second-harmonic components of the frequency 2fm included in the photodetector output. In FIG. 11A, the horizontal axis represents wavelength of the second-harmonic light, and the vertical axis represents the amplitude of the second-harmonic component. The second-harmonic component changes as indicated by curves C1, C2 and C3, in response to a change of the alternating output of the frequency fp.

Figure 11B:
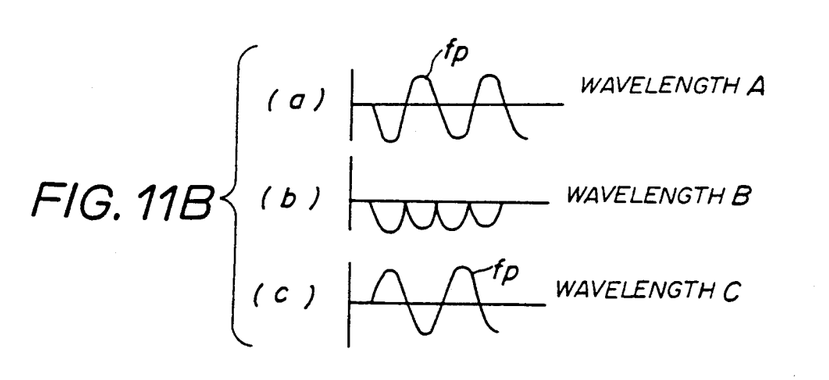
FIG. 11B is a graph of a second-harmonic component v. time characteristic for the third embodiment.

FIG. 11B is a time-based graph illustrating the above-mentioned three second-harmonic components having wavelengths A, B and C shown in FIG. 11A In FIG. 11B, the horizontal axes represent time, and the vertical axes represent the amplitude of signals. When the wavelength of the second-harmonic light is equal to the wavelength B, a signal component of a frequency twice the frequency fp is obtained as shown in FIG. 11B(b). When the wavelength of the second-harmonic light is not equal to the wavelength B, the basic wave component of the frequency fp is obtained as shown in FIG. 11B(a) or FIG. 11B(c). The basic signal shown in FIG. 11B(a) corresponding to the curve C1 is 180 degrees out of phase with the basic signal shown in FIG. 11B(c) corresponding to the curve C3.

Figure 11C:
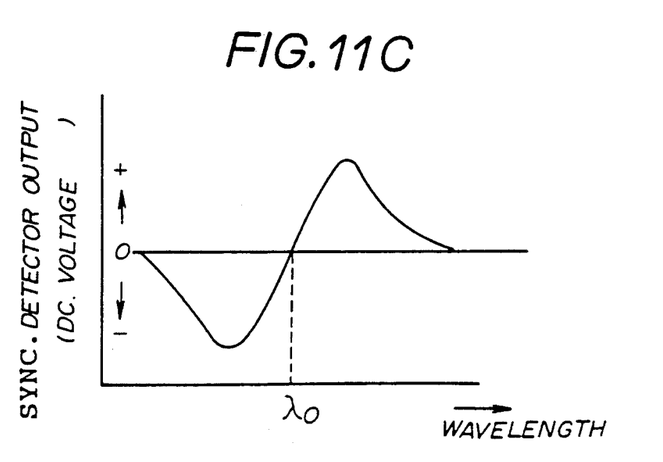
FIG. 11C is a graph of a synchronous detection output as a function of wavelength of a second-harmonic light for the third embodiment.

FIG. 11C is a graph of the synchronous detection output derived from the synchronous detection circuit 74. As shown in FIG. 11C, the polarity of the synchronous detection output is opposite on both sides of the resonance wavelength $\lambda_0$.

According to the present invention, the Q of light absorption line is increased to between $10^7$ and $10^8$, and is therefore two or three digits higher than the conventional Q. Thus, it is possible to improve not only long-term frequency stability but also short-term frequency stability. Further, the sharpened light absorption line Q can reduce phase noise and provides a narrower line width of laser beam Moreover, the present invention can provide the highly stabilized electric signal through the voltage-controlled crystal oscillator 13, which may utilized in a circuit such as a multiplying circuit provided in the vicinity of the light source. Each of the structural elements itself of the first to third embodiments of the present invention can be formed by a known element. Therefore, a detailed circuit of each structural element is omitted.

The present invention is not limited to the aforementioned embodiments, and variations and modifications may be made without departing from the scope of the claimed invention.

We claim:

1. A wavelength stabilized light source comprising:
    laser beam emitting means for emitting a laser beam provided as an output light of said light source;
    harmonic generating means for generating a harmonic light of a frequency which is n times (n is an integer equal to or larger than 2) the frequency of said laser beam;
    resonator means having a resonance cell including a resonance substance, for generating a double resonance in said resonance cell by irradiating said harmonic light supplied from said harmonic generating means onto said resonance substance and by irradiating a microwave having an alternating component onto said resonance cell, and for generating a double resonance signal based on said double resonance;
    microwave controlling means, coupled to said resonator means, for controlling said microwave to be irradiated onto said resonance cell so that the frequency of said microwave is equal to a predetermined microwave resonance frequency based on said double resonance signal supplied from said resonator means; and
    laser beam wavelength controlling means, coupled to said resonator means and said laser beam emitting means, for controlling said laser beam emitting means so that the wavelength of said harmonic light generated by said harmonic generating means is equal to a resonance wavelength of said resonance substance provided in said resonance cell based on said double resonance signal.

2. A wavelength stabilized light source as claimed in claim 1, wherein:
    said resonance substance comprises rubidium atoms,
    said laser beam emitted from said laser beam emitting means has a wavelength of 1.56 μm,
    said harmonic generating means generates said harmonic light having a frequency twice the frequency of said laser beam, and
    said harmonic light has a wavelength half the wavelength of said laser beam equal to 1.56 μm.

3. A wavelength stabilized light source as claimed in claim 1, wherein said laser beam wavelength controlling means includes detection means for detecting a peak of a signal component included in said double resonance signal, said signal component having a frequency twice the frequency of said alternating component, and control means for controlling the wavelength of said laser beam emitted from said laser beam emitting means so that said detected peak of the signal component becomes largest.

4. A wavelength stabilized light source as claimed in claim 2, wherein said rubidium atoms contains $^{87}$Rb (rubidium) atoms, and the predetermined microwave resonance frequency related to said microwave is set equal to a transition frequency of $^{87}$Rb atoms.

5. A wavelength stabilized light source as claimed in claim 1, further comprising light intensity controlling means for compensating a change of the microwave resonance frequency due to a change of light intensity of said laser beam on the basis of said double resonance signal.

6. A wavelength stabilized light source as claimed in claim 1, wherein said alternating component is a phase-modulated component, and said microwave controlling means includes synchronous detection means for subjecting said phase-modulated component to a synchronous detection process which uses a frequency equal to that of said alternating component and for outputting a synchronous detection signal, and means for controlling said microwave so that said synchronous detection signal supplied from said synchronous detection means is zero.

7. A wavelength stabilized light source comprising:
    laser beam emitting means for emitting a laser beam provided as an output light of said light source;
    light modulating means for phase-modulating said laser beam by a modulation frequency;
    harmonic generating means for generating a harmonic light of a frequency which is n times (n is an integer equal to or larger than 2) the frequency of said laser beam;

resonator means having a resonance cell including a resonance substance, for generating a double resonance in said resonance cell by irradiating said harmonic light supplied from said harmonic generating means onto said resonance substance and by irradiating a microwave onto said resonance cell and for generating a double resonance signal based on said generated double resonance, said double resonance signal including a component of said modulation frequency;

microwave controlling means, coupled to said resonator means, for controlling said microwave to be irradiated onto said resonance cell so as to be equal to a predetermined microwave resonance frequency on the basis of said double resonance signal supplied from said resonator means; and laser beam wavelength controlling means, coupled to said resonator means and said laser beam emitting means, for controlling said laser beam emitting means so that the wavelength of said harmonic light generated by said harmonic generating means is equal to a resonance wavelength of said resonance substance provided in said resonance cell based on said modulation frequency component included in said double resonance signal.

8. A wavelength stabilized light source as claimed in claim 7, wherein said laser beam wavelength controlling means comprises synchronous detection means for subjecting said modulation frequency component included in said double resonance signal to a synchronous detection process which uses a frequency identical to said modulation frequency and for outputting a synchronous detection signal, and means for controlling the wavelength of said laser beam emitted from said laser beam emitting means so that said synchronous detection signal supplied from said synchronous detection means is zero.

9. A wavelength stabilized light source as claimed in claim 7, wherein said light modulating means includes oscillating means for generating said modulation frequency, and means for phase-modulating said laser beam emitted from said laser beam emitting means by said modulation frequency derived from said oscillating means.

10. A wavelength stabilized light source as claimed in claim 7, wherein:

said resonance substance comprises rubidium atoms, said laser beam emitted from said laser beam emitting means has a wavelength of 1.56 μm, said harmonic generating means generates said harmonic light having a frequency twice the frequency of said laser beam, and said harmonic light has a wavelength half the wavelength of said laser beam equal to 1.56 μm.

11. A wavelength stabilized light source as claimed in claim 10, wherein said rubidium atoms contains $^{87}Rb$ (rubidium) atoms, and the predetermined microwave resonance frequency of said microwave is set equal to a transition frequency of $^{87}Rb$ atoms.

12. A wavelength stabilized light source as claimed in claim 7, further comprising light intensity controlling means for compensating a change of the microwave resonance frequency due to a change of light intensity of said laser beam on the basis of said double resonance signal.

13. A wavelength stabilized light source as claimed in claim 7, wherein said microwave includes a phase-modulated component, and said microwave controlling means includes synchronous detection means for subjecting said phase-modulated component to a synchronous detection process which uses a frequency equal to that of said phase-modulated component and for outputting a synchronous detection signal, and means for controlling said microwave so that said synchronous detection signal supplied from said synchronous detection means is zero.

14. A wavelength stabilized light source comprising:

laser beam emitting means for emitting a laser beam provided as an output light of said light source;

harmonic generating means for generating a harmonic light of a frequency which is n times (n is an integer equal to or larger than 2) the frequency of said laser beam;

resonator means having a resonance cell including a resonance substance, for generating a double resonance in said resonance cell by irradiating said harmonic light supplied from said harmonic generating means onto said resonance substance and by irradiating a microwave onto said resonance cell and for generating a double resonance signal based on said generated double resonance;

magnetic field providing means for providing said resonator means with a magnetic field having an alternating change, said double resonance signal including a signal component corresponding to said alternating change of said magnetic field;

microwave controlling means, coupled to said resonator means, for controlling said microwave to be irradiated onto said resonance cell so that the frequency of said microwave is equal to a predetermined microwave resonance frequency on the basis of said double resonance signal supplied from said resonator means; and laser beam wavelength controlling means, coupled to said resonator means and said laser beam emitting means, for controlling said laser beam emitting means so that the wavelength of said harmonic light generated by said harmonic generating means is equal to a resonance wavelength of said resonance substance included in said resonance cell on the basis of said signal component included in said double resonance signal.

15. A wavelength stabilized light source as claimed in claim 14, wherein said magnetic field providing means includes a coil wound around said resonator means, direct current power source means for providing a direct current, oscillating means for generating a signal of a predetermined frequency, adding means for adding said direct current and said signal derived from said oscillating means and for supplying a resultant signal to said coil, and wherein said alternating change of said magnetic field is based on said signal derived from said oscillating means.

16. A wavelength stabilized light source as claimed in claim 14, wherein said laser beam wavelength controlling means comprises synchronous detection means for subjecting said signal component included in said double resonance signal to a synchronous detection process which uses a frequency identical to that of said signal component and for outputting a synchronous detection signal, and means for controlling the wavelength of said laser beam emitted from said laser beam emitting means so that said synchronous detection signal supplied from said synchronous detection means is zero.

17. A wavelength stabilized light source as claimed in claim 14, wherein:
said resonance substance comprises rubidium atoms,
said laser beam emitted from said laser beam emitting means has a wavelength of 1.56 μm,
said harmonic generating means generates said harmonic light having a frequency twice the frequency of said laser beam, and
said harmonic light has a wavelength half the wavelength of said laser beam equal to b 1.56 μm.

18. A wavelength stabilized light source as claimed in claim 17, wherein said rubidium atoms contains $^{87}$Rb (rubidium) atoms, and the predetermined microwave resonance frequency of said microwave is set equal to a transition frequency of $^{87}$Rb atoms.

19. A wavelength stabilized light source as claimed in claim 14, further comprising light intensity controlling means for compensating a change of the microwave resonance frequency due to a change of light intensity of said laser beam based on said double resonance signal.

20. A wavelength stabilized light source as claimed in claim 14, wherein said microwave includes a phase-modulated component, and said microwave controlling means includes synchronous detection means for subjecting said phase-modulated component to a synchronous detection process which uses a frequency equal to that of said phase-modulated component and for outputting a synchronous detection signal, and means for controlling said microwave so that said synchronous detection signal supplied from said synchronous detection means is zero.

* * * * *

UNITED STATES PATENT AND TRADEMARK OFFICE
CERTIFICATE OF CORRECTION

PATENT NO. : 5,063,568
DATED : November 5, 1991
INVENTOR(S) : Chiba et al.

It is certified that error appears in the above-identified patent and that said Letters Patent is hereby corrected as shown below:

TITLE PAGE, [22], "Aug. 1, 1989" should be --Sept. 1, 1989--.

Signed and Sealed this

Eighth Day of June, 1993

Attest:

MICHAEL K. KIRK

Attesting Officer

Acting Commissioner of Patents and Trademarks